US008405447B2

(12) United States Patent
Zimlich

(10) Patent No.: US 8,405,447 B2
(45) **Date of Patent: *Mar. 26, 2013**

(54) SEMICONDUCTOR TEMPERATURE SENSOR USING BANDGAP GENERATOR CIRCUIT

(75) Inventor: David Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/175,209

(22) Filed: Jul. 1, 2011

(65) Prior Publication Data

US 2011/0260778 A1 Oct. 27, 2011

Related U.S. Application Data

(63) Continuation of application No. 12/841,362, filed on Jul. 22, 2010, now Pat. No. 7,978,000, which is a continuation of application No. 11/330,987, filed on Jan. 12, 2006, now Pat. No. 7,821,321.

(51) Int. Cl.
*H01L 35/00* (2006.01)

(52) U.S. Cl. ......................... 327/513; 327/315; 323/315

(58) Field of Classification Search .................. 327/108, 327/110, 512, 513, 539, 540, 542, 538, 434, 327/552; 323/273, 312–316, 282–284
See application file for complete search history.

(56) References Cited

U.S. PATENT DOCUMENTS 3,996,451 A 12/1976 Harrington et al.
4,433,923 A 2/1984 Rascati et al.
4,475,103 A 10/1984 Brokaw et al.
4,497,998 A 2/1985 West
4,947,057 A * 8/1990 Czarnocki et al. ............ 327/513
5,097,198 A * 3/1992 Holmdahl ...................... 323/280
5,384,740 A * 1/1995 Etoh et al. ................ 365/189.09
5,589,792 A * 12/1996 Brokaw ........................ 327/512
5,961,215 A 10/1999 Lee et al.
6,037,832 A * 3/2000 Kaminishi .................... 327/538
6,147,908 A 11/2000 Abugharbieh et al.
6,154,087 A 11/2000 Ito
6,412,977 B1 7/2002 Black et al.
6,591,210 B1 * 7/2003 Lorenz ............................ 702/99
6,726,361 B2 4/2004 Bisping et al.
6,879,141 B1 4/2005 Ho
7,225,099 B1 5/2007 O'Dwyer
7,472,030 B2 * 12/2008 Scheuerlein .................... 702/99
7,821,321 B2 10/2010 Zimlich
7,978,000 B2 7/2011 Zimlich

OTHER PUBLICATIONS

Johns & Martin, "Analog Integrated Circuit Design," Wiley and Sons, pp. 354-355, 360-361, ISBN 0471-14448-7, Nov. 1996.

* cited by examiner

*Primary Examiner* — Rajnikant Patel
(74) *Attorney, Agent, or Firm* — Schwegman, Lundberg & Woessner, P.A.

(57) ABSTRACT

A combined bandgap generator and temperature sensor for an integrated circuit is disclosed. Embodiments of the invention recognize that bandgap generators typically contain at least one temperature-sensitive element for the purpose of cancelling temperature sensitivity out of the reference voltage the bandgap generator produces. Accordingly, this same temperature-sensitive element is used in accordance with the invention as the means for indicating the temperature of the integrated circuit, without the need to fabricate a temperature sensor separate and apart from the bandgap generator. Specifically, in one embodiment, a voltage across a temperature-sensitive junction from a bandgap generator is assessed in a temperature conversion stage portion of the combined bandgap generator and temperature sensor circuit. Assessment of this voltage can be used to produce a voltage- or current-based output indicative of the temperature of the integrated circuit, which output can be binary or analog in nature.

41 Claims, 9 Drawing Sheets

SEMICONDUCTOR TEMPERATURE SENSOR USING BANDGAP GENERATOR CIRCUIT

CROSS REFERENCE TO RELATED APPLICATIONS

This application is a continuation of U.S. patent application Ser. No. 12/841,362, filed Jul. 22, 2010, which is a continuation of U.S. patent application Ser. No. 11/330,987, filed Jan. 12, 2006 (now U.S. Pat. No. 7,821,321). Priority is claimed to these applications, and they are incorporated herein by reference in their entireties.

FIELD OF THE INVENTION

Embodiments of this invention relate to a temperature sensor which uses portions of standard bandgap generator circuitry commonly used on an integrated circuit.

BACKGROUND

Bandgap generator circuitry is well known in the art of semiconductor integrated circuits, and examples of known bandgap generators 10*a* and 10*b* are shown in FIGS. 1A and 1B respectively. While it is not important to explain the intricate details of the operation of such well-known bandgap generator circuits 10*a*, 10*b*, it is noted that the point of such circuits is generally to provide a stable reference voltage, Vbg, to the integrated circuit in which the bandgap generator is located. Specifically, it is important that the reference voltage, Vbg, be (relatively) insensitive to temperature. For reasons well known to those skilled in the art, Vbg is so-named because it essentially equals the value of the bandgap of intrinsic silicon (1.2 eV) as scaled to volts from the Coulombic level (i.e., 1.2 V).

Bandgap generators usually incorporate elements with known temperature sensitivities in the hopes of "cancelling out" such sensitivities in the to-be-generated reference voltage, Vbg. Thus, in both of the exemplary bandgap generators 10*a*, 10*b* of FIGS. 1A, 1B, diodes are used. As one skilled in the art will recognize, such diodes can be traditional P-N junctions (e.g., such as D1 and D2), or can comprise P-N junctions in a bipolar transistor. For example, NPN transistor 11 in FIG. 1B is wired as a diode by virtue of the coupling of its base and collector nodes. For more information concerning bandgap generators, the reader is referred to Johns & Martin, "Analog Integrated Circuit Design," Wiley and Sons, pp. 354-55, 360-61 (1997), which is incorporated herein by reference.

Regardless, diodes have a known temperature dependence. More specifically, the voltage across the diode, $V_{D1}$, is essentially about 0.6 V at a nominal temperature (e.g., 50 degrees Celsius), and varies by about −2 mV/C (i.e., $dV_{D1}/dT=-0.002$). Accordingly, the voltage across the diode, $V_{D1}$, is approximately 0.5 V at 0 degrees Celsius, and is approximately 0.7 V at 100 degrees Celsius. The temperature dependence of the diode voltage, $V_{D1}$, is illustrated in FIG. 3B.

Again, while not worth explaining in its exhaustive detail, the bandgap generator 10*a*, 10*b*, generates a reference voltage, Vbg, which is temperature independent, which is very useful on an integrated circuit. For example, in a dynamic random access memory (DRAM) integrated circuit, a stable non-temperature-varying reference voltage, Vbg, or derivative thereof (DVC2), can be used in the sensing of the charges stored on the memory cells of the array. Because such cells generally store charges equivalent to the power supply voltage (Vcc) (logic '1') or ground (GND) (logic '0'), a voltage between these two (Vcc/2 or DVC2) is used as the comparison for sensing. Because this sensing reference voltage should not vary with temperature, it is preferably generated using Vbg. This is illustrated simply in FIG. 2, which shows a DRAM integrated circuit 20 having a bandgap generator 10*a* or 10*b*, which produces Vbg and feeds the same to a generator 25 to produce the sensing reference voltage of DVC2.

The use of a temperature-stable reference voltage Vbg for the purpose of producing the sensing reference voltage in a DRAM is but one example of the utility of a bandgap reference voltage, Vbg. Many other types of integrated circuits employ bandgap generators to produce temperature-stable reference voltages for a whole host of reasons.

Also common to integrated circuits are temperature sensors for monitoring the ambient and/or operating temperature of the integrated circuit in which the temperature sensor is located. Generally, temperature sensors, like bandgap generators 10, contain temperature-sensitive elements. However, in a temperature sensor, the temperature sensitivity of the elements are specifically exploited to produce a temperature-sensitive output, in stark contrast to a bandgap generator in which the temperature-sensitive elements are used to cancel temperature effects in the output. The output of a temperature sensor may be analog in nature, i.e., may produce a voltage or current whose magnitude scales smoothly with the sensed temperature, even if that value is digitized by an analog-to-digital (A/D) converter. Or, the output of a temperature sensor may be binary in nature. For example, depending on how the temperature sensor is tuned, it may produce a Hot/Cold* binary output signal that is logic high (logic '1') when the temperature sensed is above a set point temperature, and is logic low (logic '0') when below the set point temperature.

Temperature sensing can be performed in an integrated circuit for a number of reasons, but one important reason is to monitor power consumption in the integrated circuit. Generally, the more power (current) that is consumed by the integrated circuit, the hotter the circuit will become. At high temperatures, the integrated circuit may not perform well, or may even become damaged. Accordingly, temperature sensors can provide information to the integrated circuit regarding its temperature so that the integrated circuit can take appropriate corrective action, such as by reducing the operating frequency of the integrated circuit or disabling it temporarily to protect against thermal failure or damage. For example, in a DRAM, due to its volatile cell design, the contents of the memory cells must be periodically refreshed. However, due to increased current leakage at higher temperatures, refresh would need to occur more frequently at higher temperatures. But increasing the refresh rate will in turn increase power consumption in the integrated circuit, and will further increase its temperature, hence necessitating even more frequent refresh, etc. In short, a runaway condition can occur in which the temperature of the DRAM escalates. Eventually, the temperature of the DRAM may become sufficiently high that the DRAM could latch up, or become permanently damaged. Thus, a temperature sensor could provide the integrated circuit important information to ward off such potential operational problems.

Because or their utilities, both bandgap generators and temperature sensors are often used on the same integrated circuit. This is illustrated in simple form in FIG. 2, which shows a block diagram of an integrated circuit 20 having a bandgap generator 10*a*, 10*b* for producing a temperature-insensitive reference voltage, Vbg, as well as a temperature sensor 27 for producing a binary output (Hot/Cold*) indicative of the temperature of the integrated circuit 20 versus some temperature set point.

While both bandgap generators 10 and temperature sensors 27 are useful, it is unfortunate that they both independently take up significant real estate on the integrated circuit 20. However, because these circuits differ with regard to the temperature dependence of their output signals (the output signal of the bandgap generator is specifically designed to be insensitive to temperature whereas the output signal of the temperature sensor is specifically designed to be sensitive to temperature), it is believed that those of ordinary skill in the art have seen no logic to combine them in an effort to preserve valuable integrated circuit real estate. As will be seen in the description that follows, presented herein is an effective combination of a bandgap generator and a temperature sensor which is easy to implement, which takes up a smaller amount of real estate than the combination of both circuits taken individually, and which can be trimmed to provide a set point temperature suitable for the application at hand.

SUMMARY

A combined bandgap generator and temperature sensor for an integrated circuit is disclosed. Embodiments of the invention recognize that bandgap generators typically contain at least one temperature-sensitive element for the purpose of cancelling temperature sensitivity out of the reference voltage the bandgap generator produces. Accordingly, this same temperature-sensitive element is used in accordance with the invention as the means for indicating the temperature of the integrated circuit, without the need to fabricate a temperature sensor separate and apart from the bandgap generator. Specifically, in one embodiment, a voltage across a temperature-sensitive junction from a bandgap generator is assessed in a temperature conversion stage portion of the combined bandgap generator and temperature sensor circuit. Assessment of this voltage can be used to produce a voltage- or current-based output indicative of the temperature of the integrated circuit, which output can be binary or analog in nature.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1A:
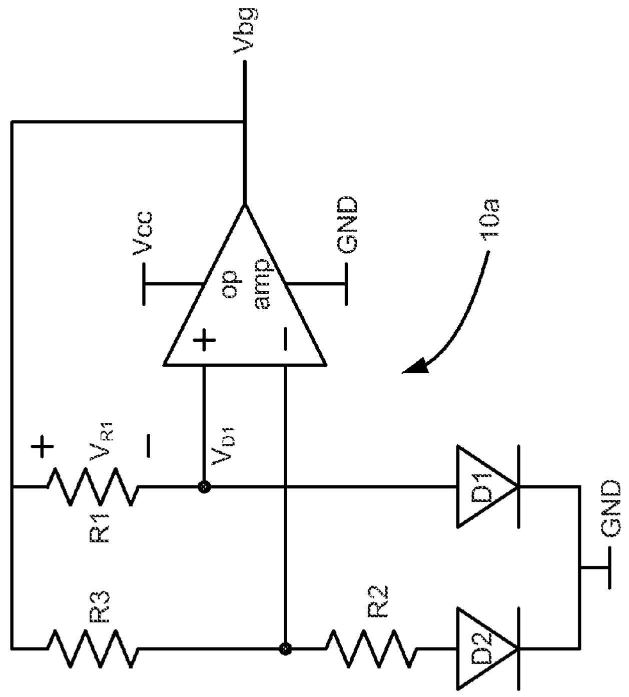
Figure 1A (prior art)
FIGS. 1A and 1B illustrate exemplary bandgap generator circuits of the prior art, including the provision of temperature-sensitive elements within the circuits.
Figure 1B:
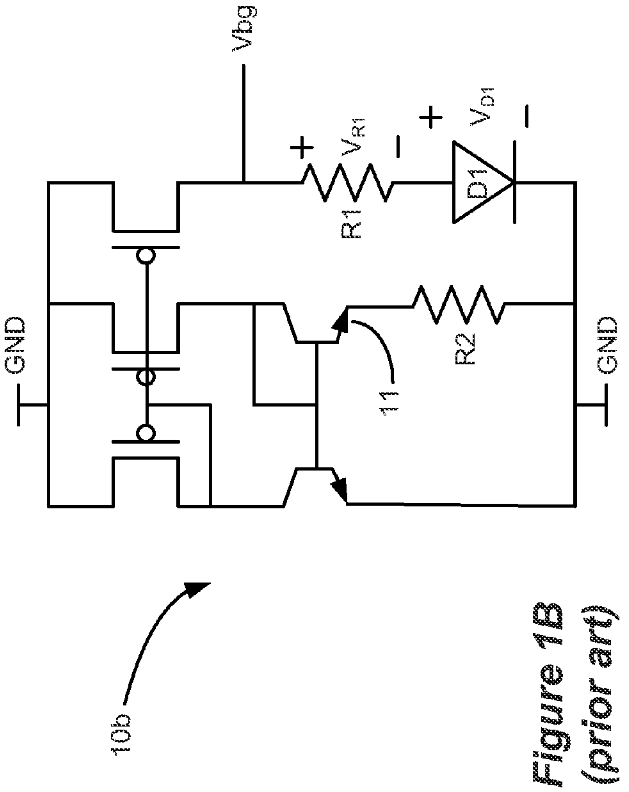
Figure 1B (prior art)

As noted above, a traditional bandgap generator 10*a*, 10*b*, such as is depicted in FIGS. 1A and 1B, contains elements such as diode D1 which are specifically intended to be temperature sensitive. Such temperature-sensitive elements are of utility in a bandgap generators because it allows temperature dependence of the bandgap reference voltage, Vbg, to be "canceled out" and rendered temperature-independent. However, in accordance with the present invention, it is realized that these same temperature-dependent elements in the bandgap generator also provide indications of the temperature of the integrated circuit, and thus can also be used as the basis for sensing the temperature of the integrated circuit. Hence, by monitoring the voltage across the temperature-sensitive element(s) in the bandgap generator, temperature sensing can be achieved without the need to design a separate temperate sensor. In other words, a bandgap generator and a temperature sensor can be combined by using the same temperature-dependent elements needed for each. By combining the circuitry of the bandgap generator and the temperature sensor in this manner, real estate in the integrated circuit is saved with no loss in performance to either circuit taken independently.

Figure 2:
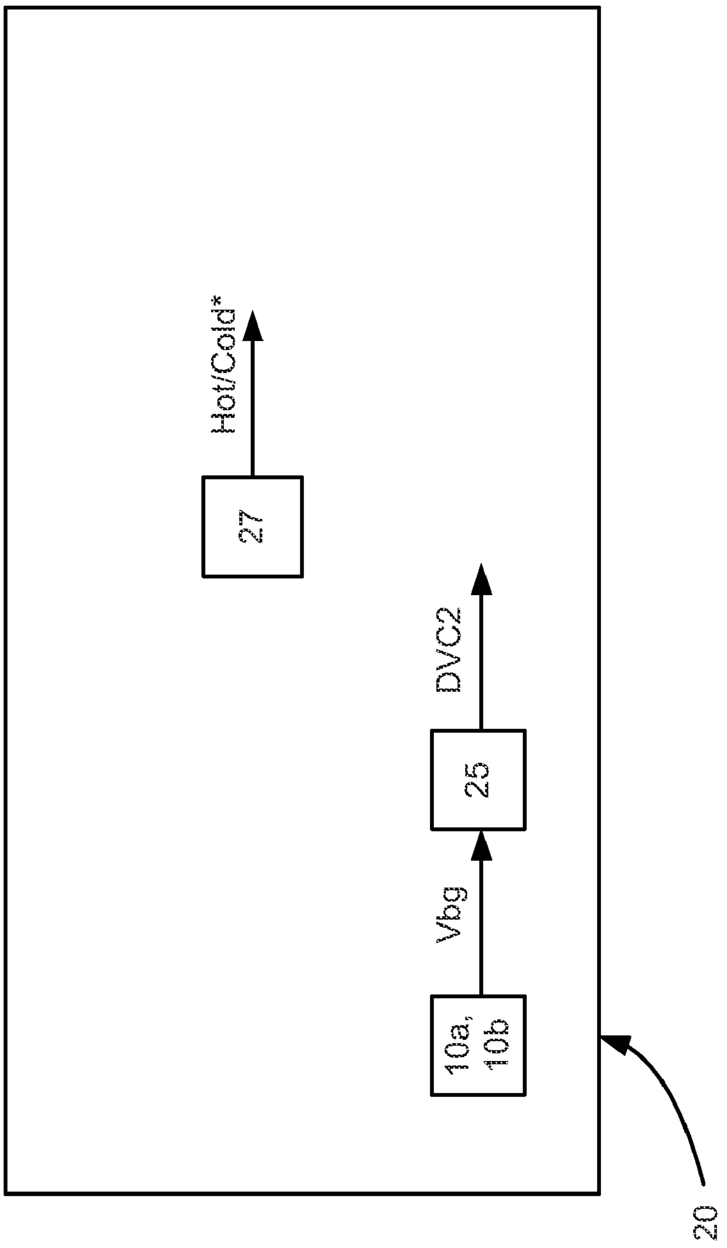
Figure 2 (prior art)
FIG. 2 illustrates a layout of an integrated circuit, and shows the provision of separate bandgap generator circuits and temperature sensors in accordance with the prior art.
Figure 3A:
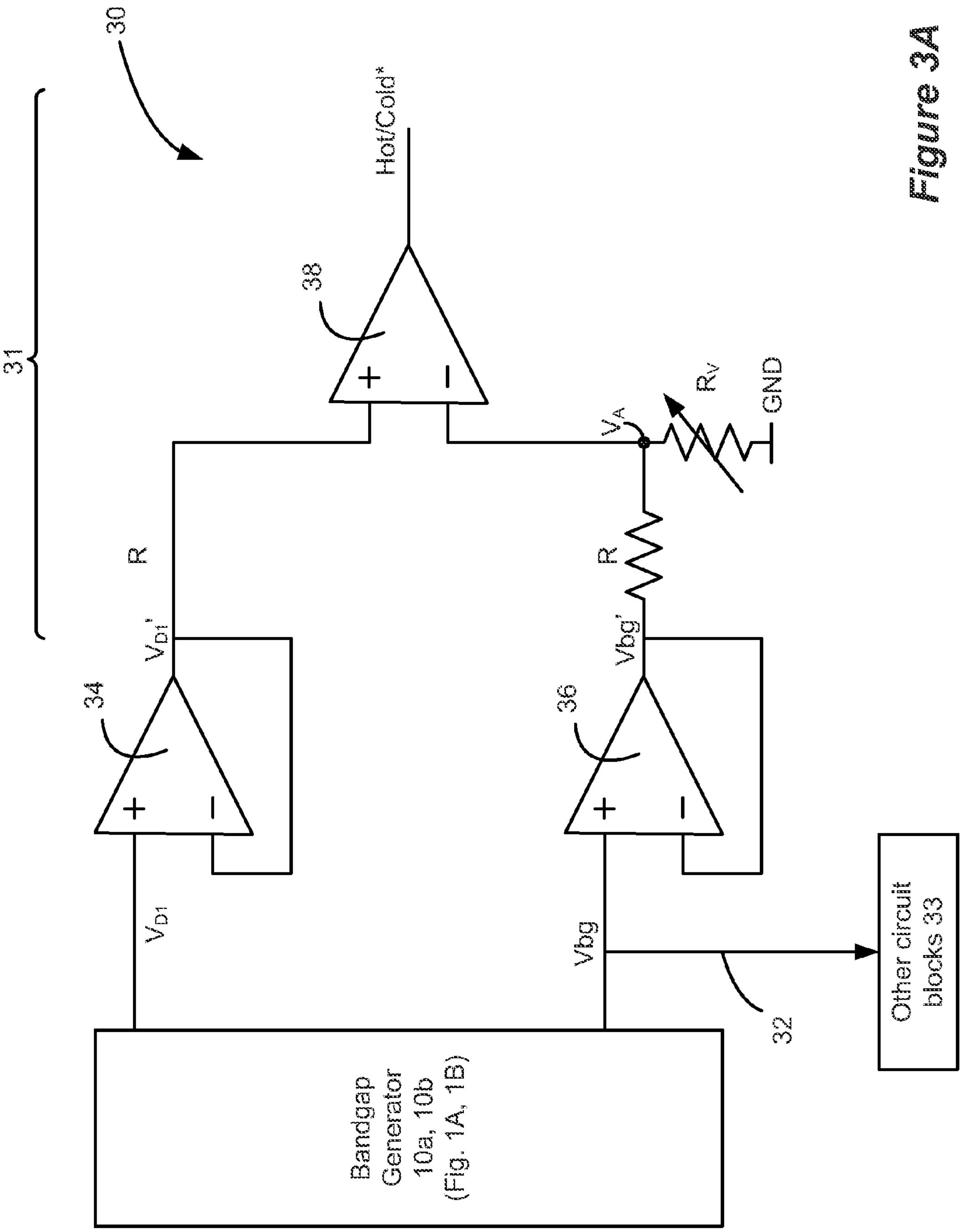
FIG. 3A illustrates an embodiment of a combined bandgap generator and temperature sensor in accordance with one embodiment of the invention, in which the temperature sensor receives its temperature information from a temperature-sensitive element in the bandgap generator circuit.

One embodiment of the combined bandgap/temperature sensor circuitry 30 is shown in FIG. 3A. As shown, the front end of the circuit comprises a bandgap generator, such as 10*a* or 10*b* and as shown in FIGS. 1A and 1B. As those earlier Figures show, the bandgap generator 10*a*, 10*b* produces a temperature-independent reference voltage, Vbg, which is preferably used as an input to a temperature conversion stage 31 of circuitry 30, so named because it converts information indicative of integrated circuit temperature (such as $V_{D1}'$) to temperature information the integrated circuit can understand. Also, as shown, the reference voltage Vbg may very well be provided to a different circuit block or blocks 33 on the integrated circuit for functions other than temperature sensing. For example, if the integrated circuit is a DRAM, one of the circuit blocks 33 could be the Vcc/2 or DVC2 generator 25 of FIG. 2.

The other input to the temperature conversion stage 31 is a temperature-sensitive voltage indicative of the temperature of at least one element from the bandgap generator 10. In one embodiment, this temperature-sensitive element is the diode D1 used in either of the exemplary bandgap generators depicted in FIGS. 1A and 1B, and the temperature-sensitive voltage across this element, $V_{D1}$, is used as an input to the temperature conversion stage 31. However, it should be noted that a temperature-sensitive voltage indicative of the temperature of at least one element need not be a voltage across that element; other voltages can be indicative of the temperature of the at least one element even if not taken directly across the element(s). For example, and referring again to FIGS. 1A and 1B, the voltage across the resistor R1, $V_{R1}$, is a voltage indicative of the temperature sensitivity of diode D1. This is because $Vbg \approx 1.2 = V_{R1} + V_{D1}$, and $V_{R1}$ therefore scales (inversely) with the voltage across the temperature-sensitive element, $V_{D1}$ (see FIG. 3B). Additionally, more than one temperature-sensitive voltage from the bandgap generator 30 may be used as an input to the temperature conversion stage 31, although not shown for ease of illustration.

Returning again to FIG. 3A, the temperature-sensitive voltage $V_{D1}$ and the temperature-insensitive voltage Vbg, are both preferably buffered by operational amplifiers ("op amps") 34 and 36 to produce equivalent-magnitude signals $V_{D1}'$ and Vbg'. While not strictly necessary in all implementations, the op amps 34 and 36 prevent the signals $V_{D1}$ and Vbg from becoming loaded down by the elements in the temperature conversion stage 31. In any event, while useful, the buffered ($V_{D1}'$ and Vbg') and unbuffered ($V_{D1}$ and Vbg) signals can be thought of as synonymous for purposes of this disclosure.

The temperature conversion stage 31 ultimately outputs a signal, Hot/Cold*, which is a binary signal indicative of whether the sensed temperature is above (logic '1') or below (logic '0') a certain temperature set point. This set point temperature can be trimmed in the disclosed embodiment by virtue of the circuitry in the temperature conversion stage 31. Specifically, notice that the bandgap input, Vbg, to op amp 38 is voltage divided using a variable resistor, $R_V$, and a non-variable resistor, R. This voltage divider sets the voltage at node A, $V_A$, to $(R_V/(R+R_V))$ * Vbg, and accordingly causes the circuitry 30 to indicate a high temperature (Hot/Cold*='1') when $V_{D1}'>V_A$, and to indicate a low temperature (Hot/Cold*='0') when $V_{D1}'<V_A$.

Figure 3B:
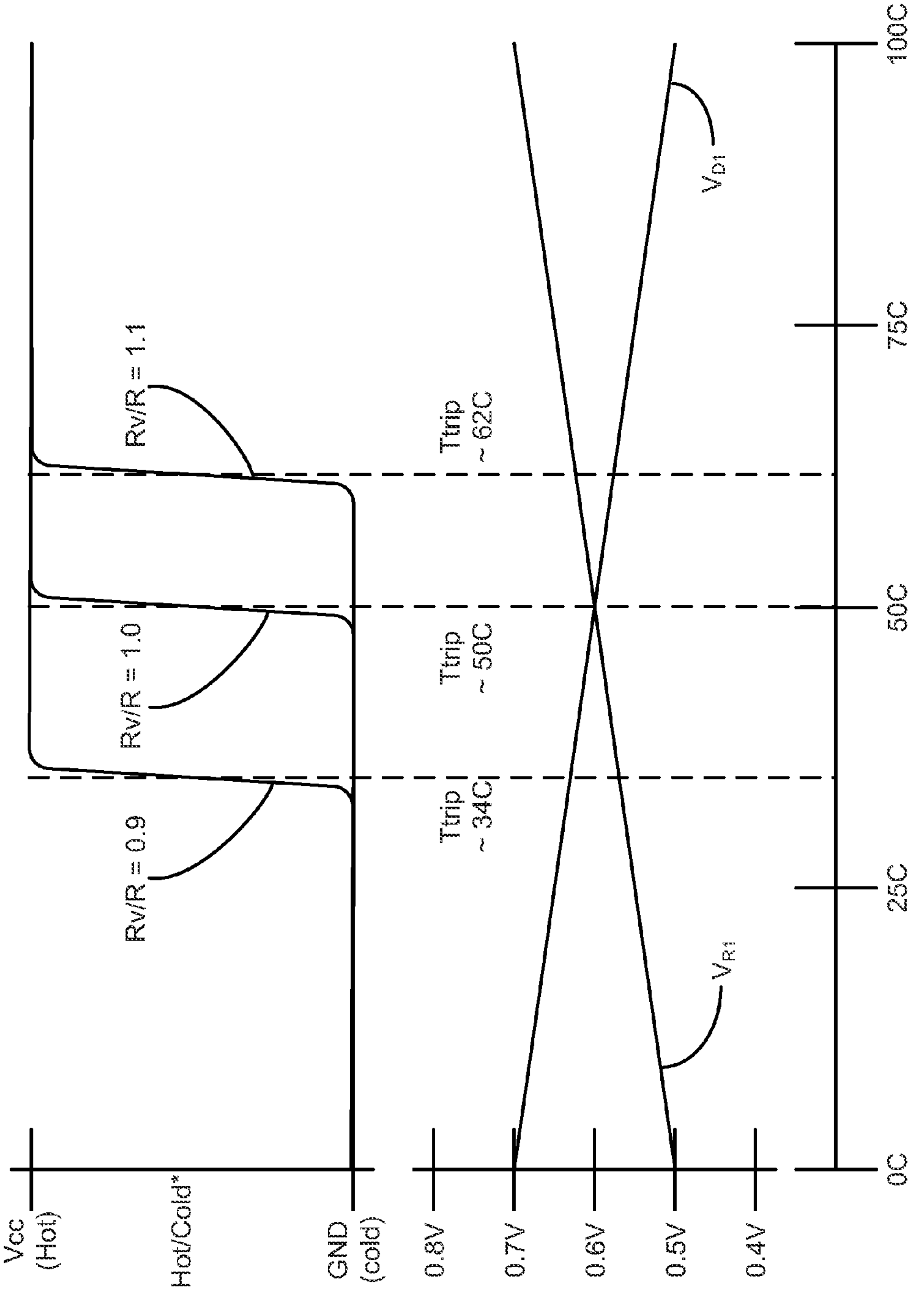
FIG. 3B illustrates how the set point temperature for the circuit of FIG. 3A can be trimmed using a variable resistor.

By varying the resistance of the variable resistor, the temperature set point can be set within a useful range, such as is illustrated in FIG. 3B. For example, when $R_V/R$ is equal to 1, then $V_A$ becomes Vbg/2, or approximately 1.2/2=0.6V. Because $V_{D1}'$ at 0.6V corresponds to approximately 50 C, this is the established set point. By contrast, if $R_V/R>1$, the temperature set point will be shifted higher. For example, if $R_V/R=1.1$, then $V_A$ becomes (1.1/2.1) * Vbg=0.624, which corresponds to a trip point of approximately 62 C. If $R_V/R<1$, the temperature set point will be shifted lower. For example, if $R_V/R=0.9$, then $V_A$ becomes (0.9/1.9) * Vbg=0.568, which corresponds to a trip point of approximately 34 C.

Variable resistor $R_V$ may be varied in many different ways, as one skilled in the art will appreciate. The value of $R_V$ may be set during fabrication of the integrated circuit to a particular value. Alternatively, the value of $R_V$ may be trimmed after fabrication of the integrated circuit is finished. Such trimming may be destructive in nature (e.g., the blowing of laser links or fuses or antifuses), or may be non-destructive (e.g., using electrically erasable cells to set the resistance value). In one simple embodiment, $R_V$ may comprise a series of smaller resistors, each of which can be programmed in or programmed out of the series using any of the above methods to trim the overall resistance. However, as noted, there are many ways known in the art to vary resistances, and no particular way is important to the invention. In a preferred embodiment, $R_V$ varies from between 0.9 and 1.1 of R, although of course this is merely exemplary and a wider or smaller range could be used in other embodiments depending on the application.

Although in a preferred embodiment Vbg is directly provided to the temperature conversion stage 31, Vbg could be first divided down by a follower circuit, etc., before being present to the op amp 36 if "headroom" is a concern. In short, the temperature conversion stage 31 need not strictly receive Vbg, but can receive a scaled version of Vbg, which scalar can equal one, less than one, or more than one.

Figure 4:
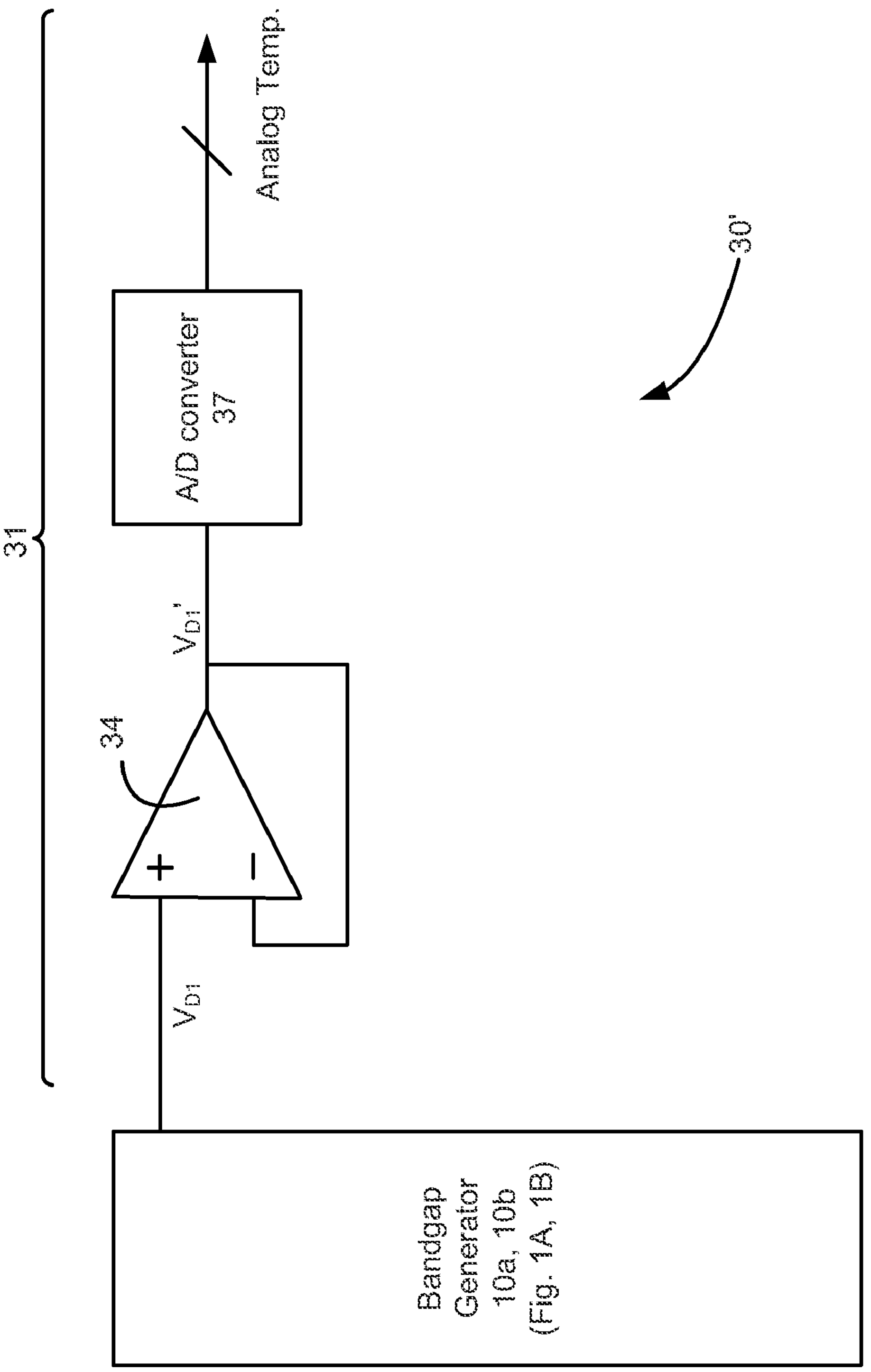
FIG. 4 illustrates how the circuit of FIG. 3A can be modified to produce an analog temperature output.

As shown, the combined circuit 30 of FIG. 3A produces a binary output, Hot/Cold*. However, because the input signal $V_{D1}'$ itself is indicative of temperature, it may be used as an analog output. One simple example of such a combined circuit 30' is shown in FIG. 4, in which $V_{D1}'$ is sent to an A/D converter 37 to produce a digitized representation of the analog value of $V_{D1}'$ so that it might be better understood by the integrated circuit and acted on accordingly, such as by reducing operating frequency, disabling the chip, etc., if the digitized temperature reading is too high. In short, the invention should be understood as including embodiments in which any temperature-sensitive element within a bandgap generator 10 is additionally used to indicate integrated circuit temperature, regardless of the means by which that temperature information is output to or sensed by the remainder of the integrated circuit.

Figure 5A:
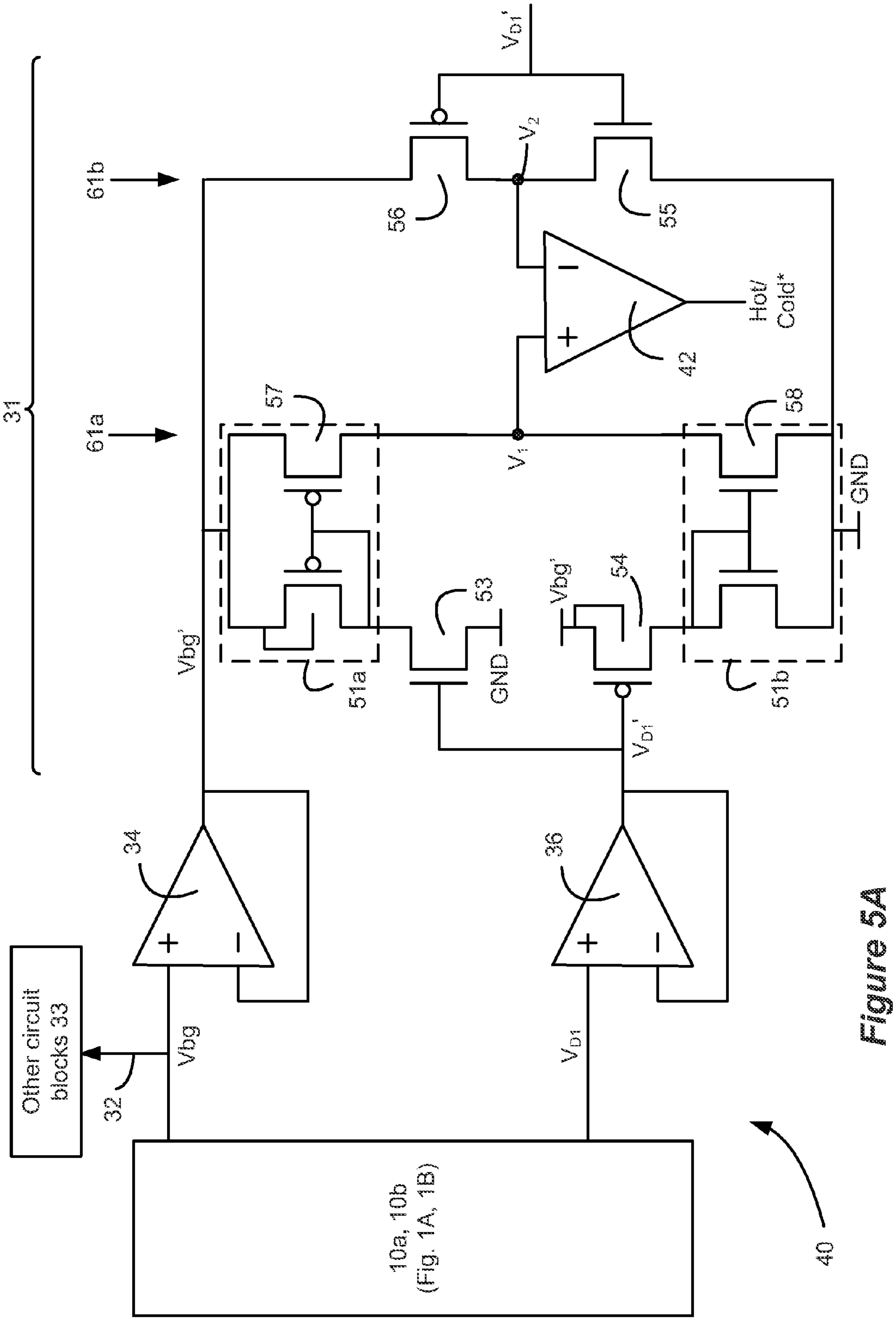
FIG. 5A illustrates another embodiment of a combined bandgap generator and temperature sensor in accordance with one embodiment of the invention, in which temperature sensing occurs via current rather than by voltage as was the case with the circuit of FIG. 3A.

Another embodiment of combined bandgap generator and temperature sensor circuitry 40 is shown in FIG. 5A. As compared to the embodiment of FIG. 3A, this embodiment has a temperature conversion stage 31' with two rails 61*a*, 61*b* that serve as the inputs to an op amp 42. In this embodiment, the temperature is sensed via an assessment of the relative transconductances ($g_m$=d(Ids)/d(Vgs)=1/R) of the output transistors 55-58 in each of the rails 61*a*, 61*b*. This can be easier to implement, and may take up less real estate as it does not use discrete resistor ratios as was the case with the embodiment of FIG. 3A. Because this temperature output is ultimately determined as a function of the currents in the rails 61*a*, 61*b*, this embodiment 40 can be understood as current-based rather than voltage-based.

As shown, the front end of the combined bandgap generator and temperature sensor circuitry 40 of FIG. 5A is no different, and again uses Vbg and $V_{D1}$ from the bandgap generator 10*a*, 10*b*, preferably in their buffered states (Vbg' and $V_{D1}'$). However, in the temperature conversion stage 31', the $V_{D1}'$ voltage alters the transconductances of the output transistors 55-58. These transconductances in turn create a voltage divider in each rail 61*a*, 61*b*, and establishes two voltages $V_1$ and $V_2$ in the center of each rail used as inputs to the op amp 42. As one skilled in the art will understand, as $V_{D1}'$ increases, output transistors 55 and 57 will be more strongly on, with output transistor 57 being driven with transistor 53's current by current mirror 51*a*. Output transistors 55 and 57 will therefore have higher transconductances than output transistors 56 and 58. Because of this relative ratio of the transconductances in each rail 61*a*, 61*b*, $V_1$ would be higher than $V_2$, and the op amp 42 would signal a hot temperature condition (Hot/Cold*=1). By contrast, as $V_{D1}'$ decreases, output transistors 56 and 58 would tend to be more strongly on, and as a result, $V_2$ would be higher then $V_1$, and op amp 42 would signal a cold temperature condition, with output transistor 58 being driven with transistor 54's current by current mirror 51*b*.

Figure 5B:
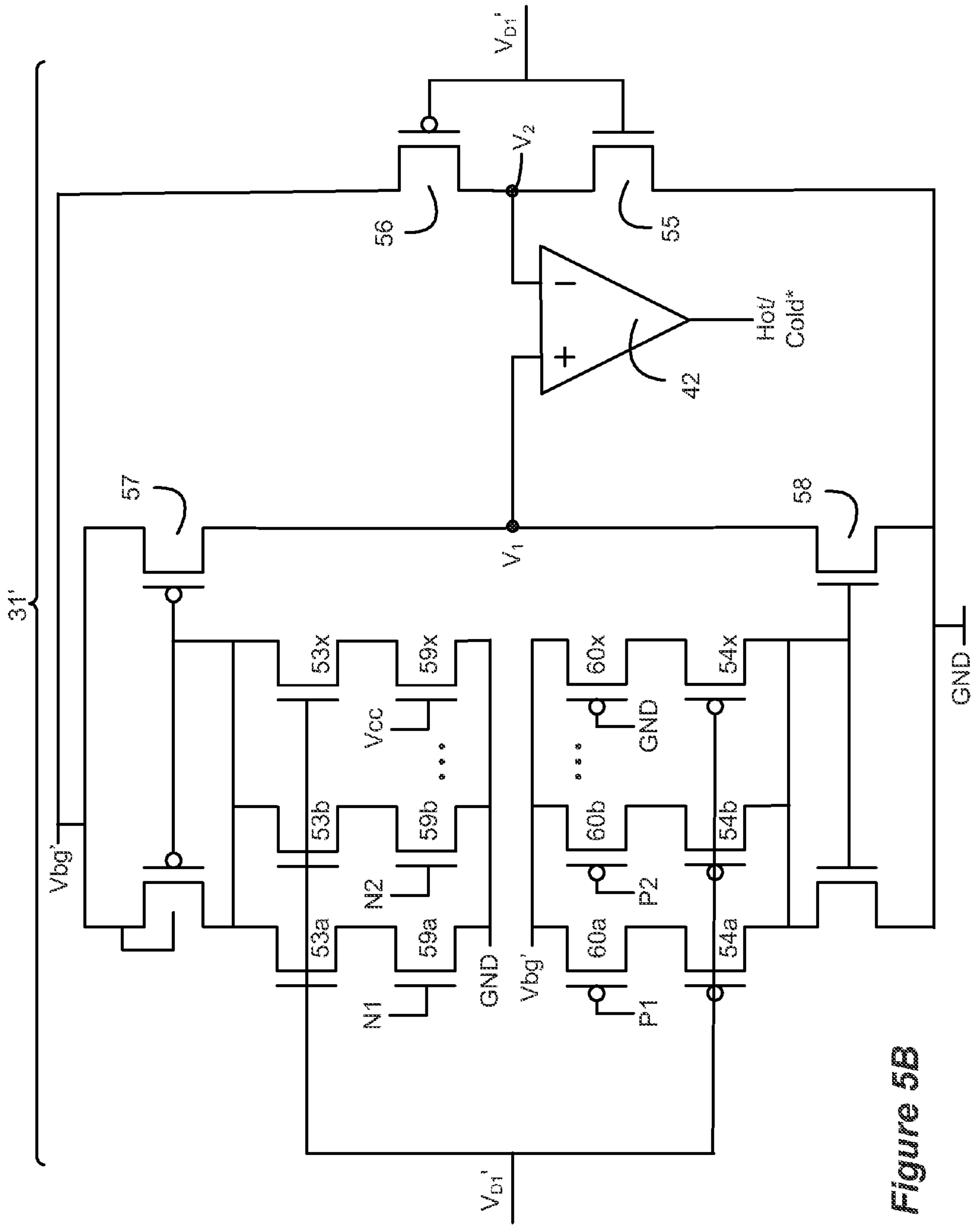
FIG. 5B illustrates how the circuit of FIG. 5A can be trimmed to adjust the set point temperature.

As shown in FIG. 5A, if it is assumed that the output transistors 55-58 are matched in their resistances, e.g., by appropriate transistor width, length, or threshold voltage adjustments, then $V_1$ will equal $V_2$ when $V_{D1}'$ is equal to Vbg/2, or approximately 0.6 V. In other words, the temperature set point of stage 31' will be approximately 50 C (see FIG. 3B). However, as was the case with the voltage-based embodiment of FIG. 3A, the current-based embodiment of FIG. 5A can also adjust the temperature set point. One embodiment for doing so is depicted in FIG. 5B, which illustrates only the temperature conversion stage 31'. As shown, additional trimming transistors 59*a*-*x* and 60*a*-*x* have been added, each of which has it own control signal, Nx or Px. By enabling or disabling various of these control signals, the temperature set point of the temperature conversion stage 31' can be affected. If no signals are enabled, the set point temperature will be approximately 50 C, as just noted. However, when one of the N-channel control signals, Nx, is enabled, output transistor 57 draws more current and its transconductance drops. This in turn increases the voltage $V_1$, with the effect that the temperature set point will increase beyond 50 C. The more N-channel control signals Nx that are enabled, the higher the set point temperature. Conversely, the P-channel trimming transistors 60 lower the set point temperature. As more control signals Px are enabled, the voltage $V_1$ will drop, decreasing the set point temperature below 50 C. However, it should be noted that such means as illustrated in FIG. 5B for adjusting the set point temperature in this current-based embodiment are merely exemplary, and that such adjustment can occur in many other different ways.

Figure 6:
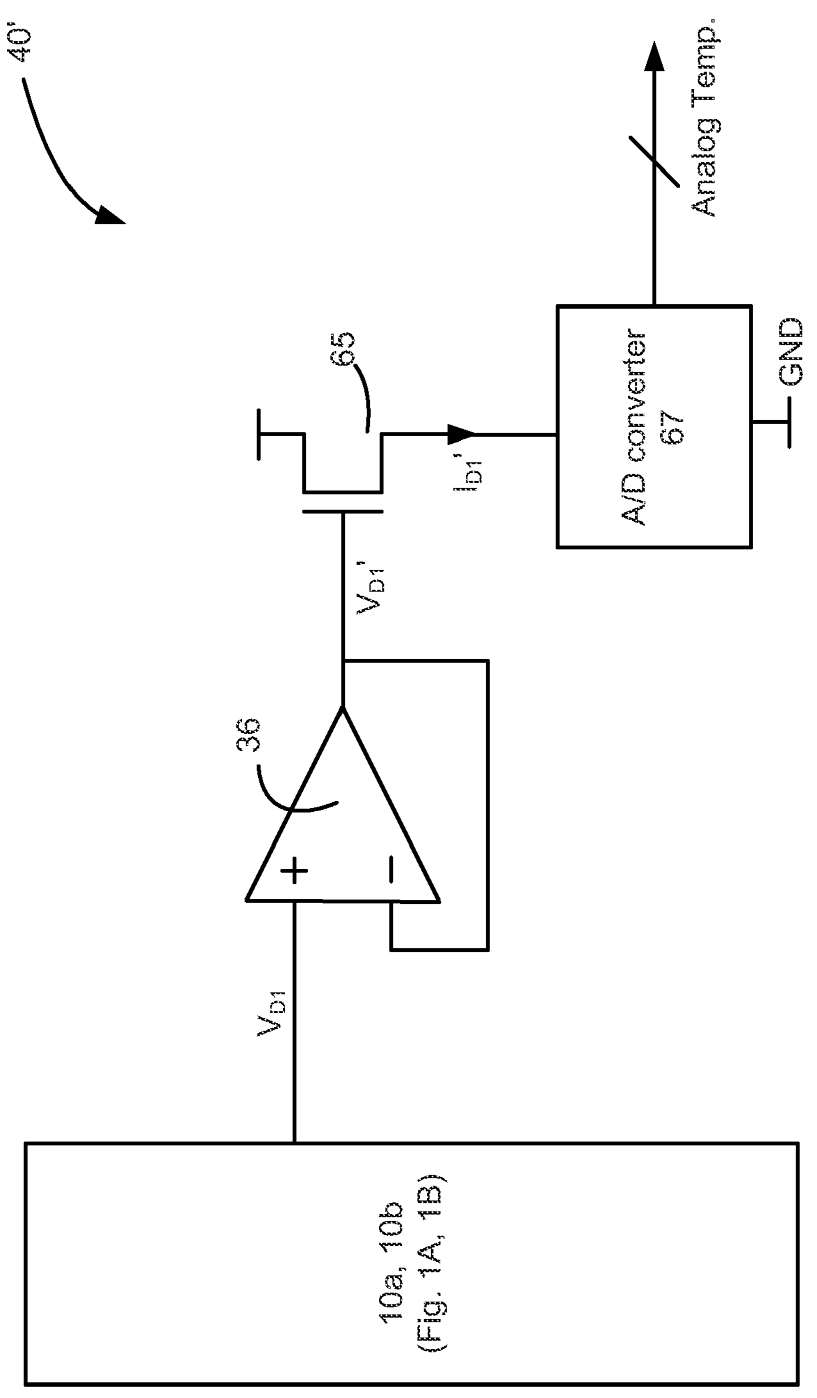
FIG. 6 illustrates how the circuit of FIG. 5A can be modified to produce an analog temperature output.

As with the voltage-based embodiment of FIG. 3A, the current-based embodiment of FIG. 5A need not produce only a binary Hot/Cold* output as shown. Instead, and as shown in FIG. 6, the output current used to indicate temperature can be analog in nature. For example, by simply providing the voltage across the diode, $V_{D1}'$, to the gate of transistor 65, a current $I_{D1}'$ can be produced which is indicative of the temperature. When sent to an A/D current converter 67, the analog value of the current $I_{D1}'$ can be digitized and put into a form easier for the integrated circuit to understand. To thus reiterate a point made earlier, the invention should be understood as including embodiments in which any temperature-sensitive element within a bandgap generator 10 is additionally used to indicate integrated circuit temperature, regardless of the means by which that temperature information is output to or sensed by the remainder of the integrated circuit.

Figure 7:
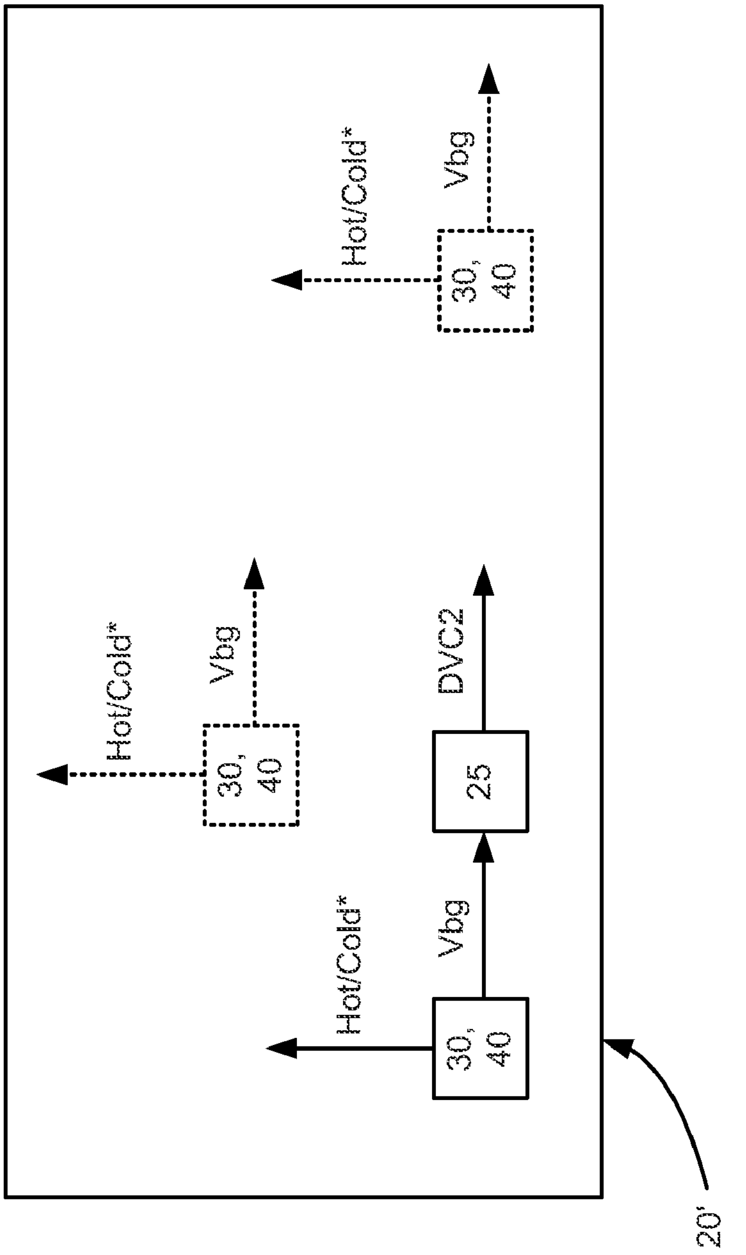
FIG. 7 illustrates a layout of an integrated circuit having at least one combined bandgap generator and temperature sensor in accordance with one embodiment of the invention.

To summarize the various embodiments of the invention, the temperature elements within bandgap generator circuits are additionally used as a means for indicating the temperature of integrated circuits, i.e., as a portion of temperature sensors for integrated circuits. By so combining the bandgap generator and temperature sensing circuits, temperature-sensitive elements do not need to be redundantly fabricated for each circuit. As a result space on the integrated circuit is saved. This is depicted in FIG. 7, which shows a combined bandgap/temperature sensor circuit such as 30 (FIG. 3A) or 40 (FIG. 5A), which produces both a temperature output (Hot/Cold*, or an analog output as depicted in FIGS. 4 and 6), as well as a temperature-independent reference voltage, Vbg, useful to other circuit blocks (such as Vcc/2 or DVC2 generator 25). Because of its efficient size, the combined bandgap/temperature sensor circuit 30 or 40 may be repeated in multiple places across the extent of the real estate of the integrated circuit 20', as shown in dotted lines.

It should be understood that the inventive concepts disclosed herein are capable of many modifications. To the extent such modifications fall within the scope of the appended claims and their equivalents, they are intended to be covered by this patent.

What is claimed is:

1. A temperature sensor circuit for an integrated circuit, comprising:
- a generator for producing a temperature independent voltage and a temperature dependent voltage using a same temperature sensitive element in the generator; and
- an amplifier for comparing the temperature independent voltage or a representation of the temperature independent voltage with the temperature dependent voltage or a representation of the temperature dependent voltage,
- wherein the amplifier outputs an output signal indicative of a temperature of the integrated circuit.

2. The temperature sensor circuit of claim 1, further comprising a buffer, wherein the representation of the temperature independent voltage is to be produced by passing the temperature independent voltage through the buffer.

3. The temperature sensor circuit of claim 1, further comprising a buffer, wherein the representation of the temperature dependent voltage is to be produced by passing the temperature dependent voltage through the buffer.

4. The temperature sensor circuit of claim 1, further comprising a follower circuit, wherein the representation of the temperature independent voltage is to be produced by passing the temperature dependent voltage through the follower circuit.

5. The temperature sensor circuit of claim 4, wherein the representation of the temperature independent voltage is smaller than the temperature independent voltage.

6. The temperature sensor circuit of claim 1, further comprising a voltage divider, wherein the representation of the temperature independent voltage comprises a voltage divided version of the temperature independent voltage produced by the voltage divider.

7. The temperature sensor circuit of claim 6, wherein the voltage divider is adjustable.

8. The temperature sensor circuit of claim 6, wherein the voltage divider comprises discrete resistors.

9. The temperature sensor circuit of claim 1, wherein the representation of the temperature independent voltage is adjustable.

10. The temperature sensor circuit of claim 1, further comprising a circuit block distinct from the generator for receiving the temperature independent reference voltage.

11. The temperature sensor circuit of claim 10, wherein the circuit block comprises another generator for producing a second temperature independent voltage for sensing logic values in an array of memory cells on the integrated circuit.

12. The temperature sensor circuit of claim 1, wherein the generator comprises a bandgap generator, and wherein the temperature independent voltage comprises a bandgap voltage.

13. The temperature sensor circuit of claim 1, wherein the output signal is binary and is to indicate the temperature relative to a set point temperature.

14. The temperature sensor circuit of claim 13, wherein the set point temperature is trimmable.

15. The temperature sensor circuit of claims 14, wherein the set point temperature is trimmable by adjusting the representation of the temperature independent voltage.

16. The temperature sensor circuit of claim 1, wherein the output signal is analog.

17. The temperature sensor circuit of claim 1, wherein the temperature dependent voltage comprises a voltage across the same temperature sensitive element.

18. The temperature sensor circuit of claim 1, wherein the generator comprises a resistor, and wherein the temperature dependent voltage comprises a voltage across the resistor.

19. The temperature sensor circuit of claim 1, wherein the temperature dependent voltage is not to be taken directly across the temperature sensitive element.

20. A temperature sensor circuit for an integrated circuit, comprising:
- a generator circuit for producing a temperature independent voltage and a temperature dependent voltage using a same temperature sensitive element in the generator;
- an amplifier for producing an output signal indicative of a temperature of the integrated circuit;
- a first voltage divider for producing a first input to the amplifier, wherein the first voltage divider is to produce at the first input a voltage divided version of the temperature independent voltage or a representation of the temperature independent voltage, wherein the first voltage divider is to be controlled by the temperature dependent voltage or a representation of the temperature dependent voltage; and a second voltage divider for producing a second input to the amplifier, wherein the second voltage divider is to produce at the second input a voltage divided version of the temperature independent voltage or a representation of the temperature independent voltage, wherein the second voltage divider is to be controlled by the temperature dependent voltage or a representation of the temperature dependent voltage.

21. The temperature sensor circuit of claim 20, further comprising a buffer, wherein the representation of the temperature independent voltage is to be produced by passing the temperature independent voltage through the buffer.

22. The temperature sensor circuit of claim 20, further comprising a buffer, wherein the representation of the temperature dependent voltage is to be produced by passing the temperature dependent voltage through the buffer.

23. The temperature sensor circuit of claim 20, further comprising a follower circuit, wherein the representation of the temperature independent voltage is to be produced by passing the temperature dependent voltage through the follower circuit.

24. The temperature sensor circuit of claim 23, wherein the representation of the temperature independent voltage is smaller than the temperature independent voltage.

25. The temperature sensor circuit of claim 20, wherein at least one of the first or the second voltage dividers comprise transistors.

26. The temperature sensor circuit of claim 25, wherein the first voltage divider comprises a first transistor between the temperature independent voltage or the representation of the temperature independent voltage and the first input, and a second transistor between the first input and ground, and wherein the second voltage divider comprises a third transistor between the temperature independent voltage or the representation of the temperature independent voltage and the second input, and a fourth transistor between the second input and ground.

27. The temperature sensor of claim 26, wherein the first and second transistors are contained within first and second current mirrors.

28. The temperature sensor circuit of claim 26, wherein at least the first voltage divider is trimmable to affect a transconductance of the at least one of the first, second, third, or fourth transistors.

29. The temperature sensor circuit of claim 26, wherein the output signal is a function of the relative transconductances of the first, second, third, and fourth transistors.

30. The temperature sensor circuit of claim 20, wherein an increase in the temperature dependent voltage or the representation of the temperature dependent voltage that controls the first and second voltage dividers is to cause a value of the first input to increase and a value of the second input to decrease, and wherein a decrease in the temperature dependent voltage or a representation of the temperature dependent voltage that controls the first and second voltage dividers is to cause a value of the first input to decrease and a value of the second input to increase.

31. The temperature sensor circuit of claim 20, further comprising a circuit block distinct from the generator for receiving the temperature independent reference voltage.

32. The temperature sensor circuit of claim 31, wherein the circuit block comprises another generator for producing a second temperature independent voltage for sensing logic values in an array of memory cells on the integrated circuit.

33. The temperature sensor circuit of claim 20, wherein the generator comprises a bandgap generator, and wherein the temperature independent voltage comprises a bandgap voltage.

34. The temperature sensor circuit of claim 20, wherein the output signal is binary and is to indicate the temperature relative to a set point temperature.

35. The temperature sensor circuit of claim 34, wherein the set point temperature is trimmable.

36. The temperature sensor circuit of claim 35, wherein the set point is trimmable by adjusting at least one of the first or second voltage dividers.

37. The temperature sensor circuit of claim 20, wherein the output signal is analog.

38. The temperature sensor circuit of claim 20, wherein the temperature dependent voltage comprises a voltage across the same temperature sensitive element.

39. The temperature sensor circuit of claim 20, wherein the generator comprises a resistor, and wherein the temperature dependent voltage comprises a voltage across the resistor.

40. The temperature sensor circuit of claim 20, wherein the temperature dependent voltage is not to be taken directly across the temperature sensitive element.

41. The temperature sensor circuit of claim 1, wherein the same temperature sensitive element is to cancel out temperature sensitivities from an input voltage to generate the temperature independent voltage.

* * * * *

UNITED STATES PATENT AND TRADEMARK OFFICE

CERTIFICATE OF CORRECTION

PATENT NO. : 8,405,447 B2
APPLICATION NO. : 13/175209
DATED : March 26, 2013
INVENTOR(S) : David Zimlich It is certified that error appears in the above-identified patent and that said Letters Patent is hereby corrected as shown below:

In the Claims

In column 8, line 42, in Claim 15, delete "claims" and insert -- claim --, therefor.

In column 9, line 42, in Claim 27, after "sensor" insert -- circuit --.

Signed and Sealed this
Twenty-eighth Day of May, 2013

Teresa Stanek Rea
*Acting Director of the United States Patent and Trademark Office*